United States Patent
Liu et al.

(10) Patent No.: US 11,682,586 B2
(45) Date of Patent: Jun. 20, 2023

(54) SEMICONDUCTOR STRUCTURE AND FABRICATION METHOD

(71) Applicants: Semiconductor Manufacturing International (Shanghai) Corporation, Shanghai (CN); Semiconductor Manufacturing International (Beijing) Corporation, Beijing (CN)

(72) Inventors: Jian Qiang Liu, Beijing (CN); Chao Tian, Beijing (CN); Zi Rui Liu, Beijing (CN); Ching Yun Chang, Beijing (CN); Ai Ji Wang, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/644,163

(22) Filed: Dec. 14, 2021

(65) Prior Publication Data
US 2022/0108925 A1    Apr. 7, 2022

Related U.S. Application Data

(62) Division of application No. 16/452,114, filed on Jun. 25, 2019, now Pat. No. 11,227,803.

(30) Foreign Application Priority Data

Jun. 25, 2018 (CN) .......... 201810665699.1

(51) Int. Cl.
*H01L 29/49* (2006.01)
*H01L 21/8234* (2006.01)
(Continued)

(52) U.S. Cl.
CPC .. *H01L 21/82345* (2013.01); *H01L 21/28088* (2013.01); *H01L 27/092* (2013.01); *H01L 29/4966* (2013.01)

(58) Field of Classification Search
CPC ........ H01L 21/28026–28114; H01L 21/76882; H01L 21/76877–76883;
(Continued)

(56) References Cited

U.S. PATENT DOCUMENTS 5,880,023 A    3/1999    Jun
5,911,113 A    6/1999    Yao et al.
(Continued)

OTHER PUBLICATIONS

Wikipedia—Atomic radii of the elements (data page) (Year: 2020).

*Primary Examiner* — Eric A. Ward
(74) *Attorney, Agent, or Firm* — Anova Law Group, PLLC

(57) ABSTRACT

A semiconductor structure is provided. The semiconductor structure includes: a base substrate having an opening; and a first gate layer formed in the opening. In the first gate layer closes a top of the opening and the first gate layer includes at least one void. The semiconductor structure further includes a second gate layer formed on the first gate layer. An atomic radius of the material of the second gate layer is smaller than gaps among atoms of the material of the first gate layer and the void is filled by atoms of one of the material of the first gate layer and the material of the second gate layer.

7 Claims, 4 Drawing Sheets

(51) Int. Cl.
*H01L 21/28* (2006.01)
*H01L 27/092* (2006.01)
*H01L 21/283* (2006.01)

(58) Field of Classification Search
CPC ... H01L 21/823437–823456; H01L 23/53219;
H01L 23/53223; H01L 29/49–4991;
H01L 29/66545
See application file for complete search history.

(56) References Cited

U.S. PATENT DOCUMENTS

| | | | |
|---|---|---|---|
| 6,376,369 | B1 | 4/2002 | Doan |
| 8,940,635 | B1 | 1/2015 | Chi et al. |
| 9,478,538 | B1 * | 10/2016 | Kim ............... H01L 29/66545 |
| 2013/0323919 | A1 | 12/2013 | Teo et al. |
| 2018/0151372 | A1 | 5/2018 | Sie et al. |

* cited by examiner

US 11,682,586 B2

SEMICONDUCTOR STRUCTURE AND FABRICATION METHOD

CROSS-REFERENCES TO RELATED APPLICATIONS

This application is a divisional of U.S. patent application Ser. No. 16/452,114, filed on Jun. 25, 2019, which claims the priority of Chinese patent application No. 201810665699.1, filed on Jun. 25, 2018, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

With the continuous development of semiconductor technologies, the integration level of semiconductor devices has been continuously increased. Accordingly, more transistors are required to be formed on a single chip.

The threshold voltage is an important parameter of a transistor, and has an important influence on the performance of the transistor. Transistors having different functions tend to have different requirements for the threshold voltages, and the threshold voltages of the different transistors need to be adjusted in the process for forming the different transistors. To adjust the threshold voltages of the different transistors, function layers are often formed on the gate dielectric layers of the transistors. By selecting the thicknesses and materials of the work function layers, the transistors can have different threshold voltages.

However, the fabrication processes may have a significant influence on the performance of the work function layers; and the performance of the semiconductor devices may not be as desired. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate having an opening and forming a first gate layer in the opening. The first gate layer closes a top of the opening and includes a void. The method also includes formed a second gate layer on the first gate layer. An atomic radius of a material of the second gate layer is smaller than gaps among atoms of the material of the first gate layer. Further, the method includes performing a thermal annealing process to cause atoms of the material of the second layer to pass through the first gate layer to fill the void.

Another aspect of the present disclosure includes a semiconductor structure. The semiconductor structure includes a semiconductor substrate having an opening and a first gate layer formed in the opening. The first gate layer closes a top of the opening and the first gate layer includes a void. The semiconductor structure also includes a second gate layer formed on the first gate layer. An atomic radius of the material of the second gate layer is smaller than gaps among atoms of the material of the first gate layer and the void is filled by atoms of one of the material of the first gate layer and the material of the second gate layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
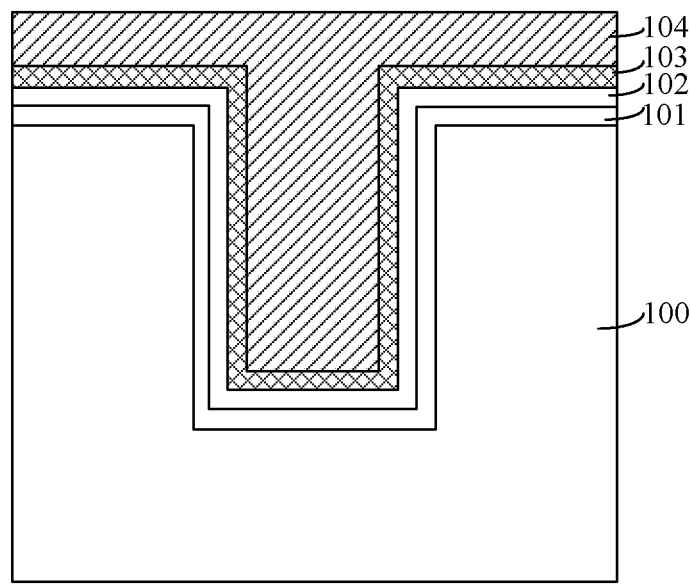
FIG. 1 illustrates a PMOS transistor.

FIG. 1 illustrates a PMOS transistor. As shown in FIG. 1, the process for forming the PMOS transistor includes providing a semiconductor substrate 100. The semiconductor substrate 100 includes an opening (not labeled). Then, a work function layer 101 is formed in the opening; and a barrier structure 102 is formed on the top surface of the work function layer 101. Further, a first gate layer 103 is formed on the barrier structure 102; and a second gate layer 104 is formed on the first gate layer 103.

In such a semiconductor structure, aluminum is selected as the material of the second gate layer 104, which is advantageous for improving the conductivity of the second gate layer 104. The material of the work function layer 101 is titanium nitride. To improve the interface state between the work function layer 101 and the second gate layer 104, before forming the second gate layer 104, the first gate layer 103 is formed on the work function layer 101.

Because the aspect ratio (i.e., a depth-to-width ratio) of the opening is constant, when the thickness of the first gate layer 103 is substantially thick, after the first gate layer 103 is formed, the aspect ratio of the opening is increased. When the aspect ratio of the opening is increased, it is disadvantageous for the subsequent formation of the second gate layer 104. Thus, to reduce the difficulty in forming the second gate layer 104, the thickness of the first gate layer 103 is reduced.

Before forming the first gate layer 103, the barrier structure 102 is formed on the top surface of the work function layer 101 for preventing atoms in the second gate layer 104 from diffusing into the work function layer 101. Meanwhile, to reduce the difficulty in subsequently forming the first gate layer 103 and the second gate layer 104, the thickness of the barrier structure 102 is also substantially thin.

However, the thicknesses of the first gate layer 103 and the barrier structure 102 are both substantially small such that the blocking ability of the first gate layer 103 and the barrier structure 102 to the atoms in the second gate layer 104 is insufficient. Thus, the atoms in the second gate layer 104 easily pass through the first gate layer 103 and the barrier structure 102 to reach the work function layer 101; and the performance of the work function layer 101 is adversely affected. Accordingly, it is disadvantageous for improving the performance of the semiconductor device.

The present disclosure provides a semiconductor structure and a method for forming a semiconductor structure. The method may include forming a first gate layer on the work function layer. The first gate layer may close the top of the opening, and the first gate layer may have a void inside. Then, a second gate layer may be formed on the top surface of the first gate layer. The atomic radius of the material of the second gate layer may be smaller than gaps among atoms of the material of the first gate layer. Further, the method may include performing an annealing process. During the annealing process, the atoms of the material of the second gate layer may pass through the first gate layer to fill the void. The method may be able to improve the performance of the semiconductor device.

Figure 6:
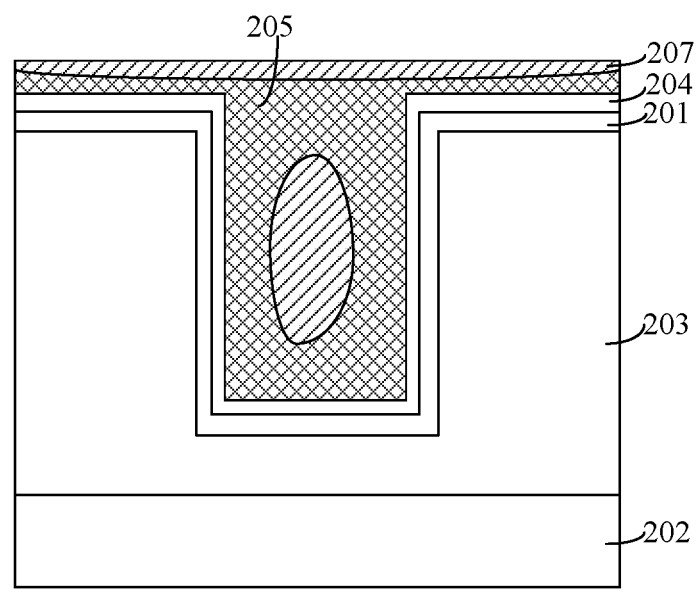
Figure 7:
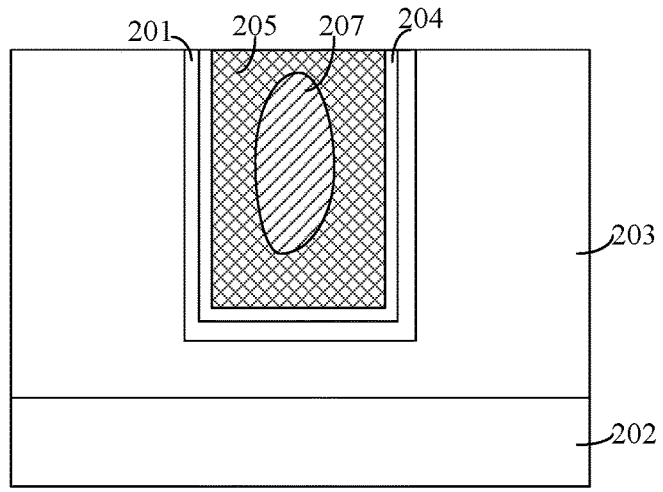
Figure 8:
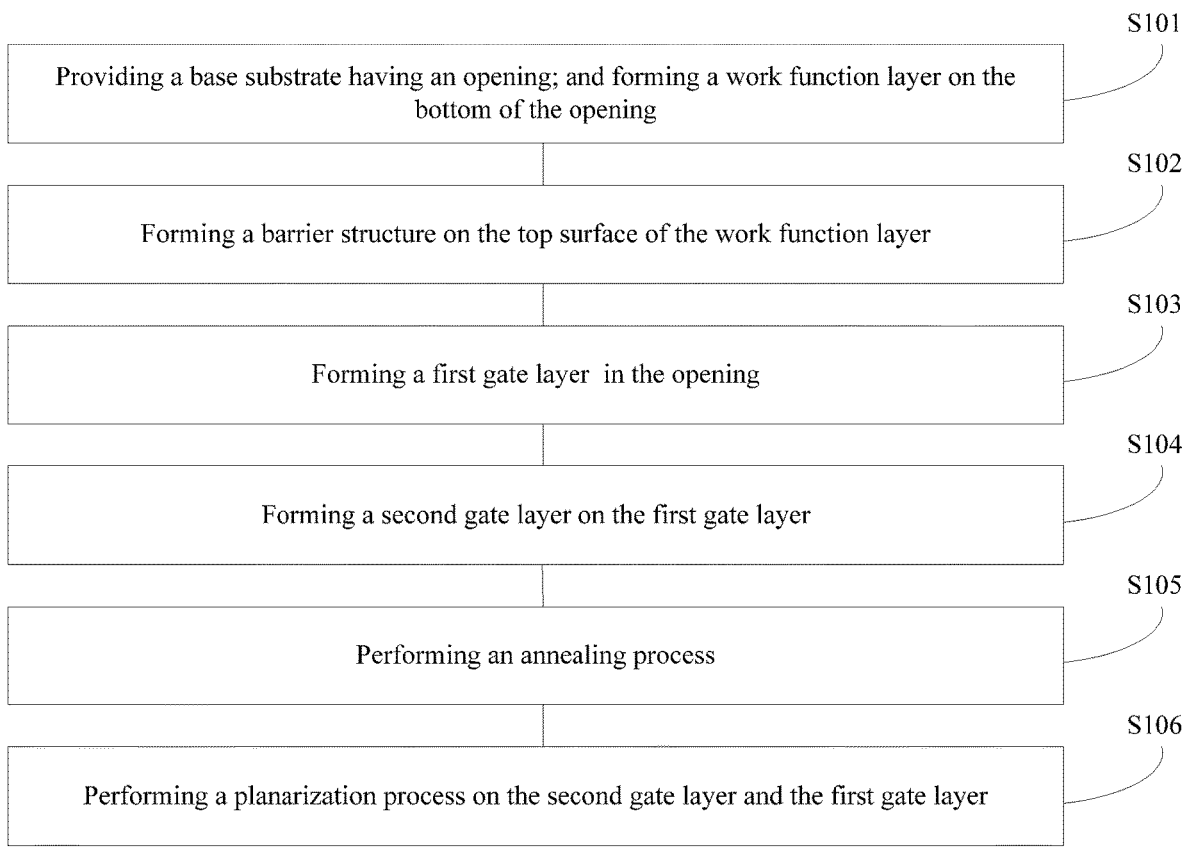
FIG. 8 illustrates an exemplary fabrication process of a semiconductor structure consistent with various disclosed embodiments.

FIG. 8 illustrates an exemplary fabrication method of a semiconductor structure consistent with various disclosed embodiments. FIGS. 2-7 illustrate structures corresponding to certain stages during the exemplary method for forming a semiconductor structure consistent various disclosed embodiments.

Figure 2:
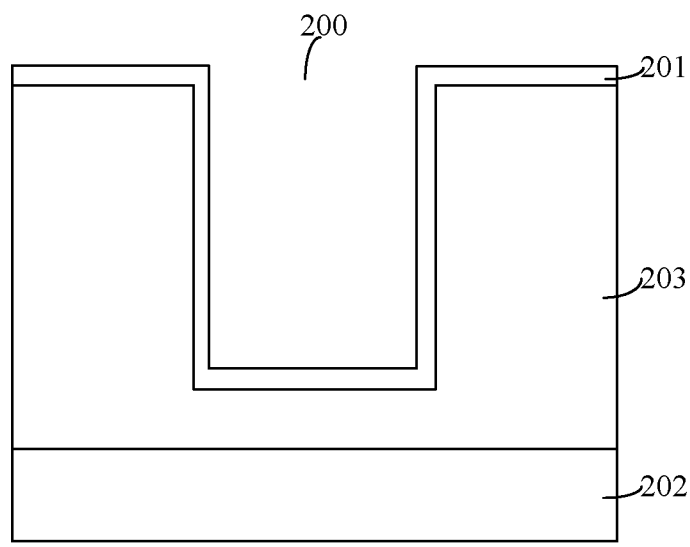
FIGS. 2-7 illustrate structures corresponding to certain stages during an exemplary fabrication process of a semiconductor structure consistent with various disclosed embodiments.

As shown in FIG. 8, at the beginning of the fabrication process, a base substrate with certain structures is provided. FIG. 2 illustrates a corresponding structure.

As shown in FIG. 2, a base substrate is provided. The base substrate may include an opening 200 therein; and a work function layer 201 may be formed at the bottom of the opening 200.

The base substrate may include a semiconductor substrate 202 and a dielectric layer 203 formed on a top surface of the substrate 202. The opening 200 may be located (formed) in the dielectric layer 203.

The semiconductor substrate 202 may be made of any appropriate material, such as silicon, silicon germanium, germanium, silicon on insulator (SOI), or germanium on insulator (GOI), etc.

The method for forming the dielectric layer 203 and the opening 200 may include forming a dummy gate structure (not shown) on the top surface of the semiconductor substrate 202; forming a doped source/drain in the semiconductor substrate 202 at each side of the dummy gate structure; forming the dielectric layer 203 on the surface of the semiconductor substrate 202 and the top surfaces of the doped source/drain regions, and sidewall surfaces of the dummy gate structure; and removing the dummy gate structure. Thus, the dielectric layer 203 with the opening 200 may be formed on the semiconductor substrate 202.

The dummy gate structure may include a dummy gate dielectric layer (not shown) and a dummy gate layer (not shown) on the top surface of the dummy gate dielectric layer. The dummy gate dielectric layer may be made of any appropriate material, such as silicon oxide, etc. The dummy gate layer may be made of any appropriate material, such as silicon, etc.

The doped source/drain regions may be doped with source/drain ions; and the conductivity type of the source/drain ions may be related to the type of the transistor. When the to-be-formed transistor is a PMOS transistor, the source/drain ions may be P-type ions, such as boron ions, etc. When the to-be-formed transistor is an NMOS transistor, the source/drain ions may be N-type ions, such as phosphorus ions, or arsenic ions, etc.

The method for forming the dielectric layer 203 may include forming a dielectric material layer on the semiconductor substrate 202 and the top surfaces of the doped source/drain regions, and the sidewall surfaces and the top surface of the dummy gate structure; planarizing the dielectric material layer until the top surface of the dummy gate structure is exposed. Thus, the dielectric layer 203 may be formed.

The dielectric material layer may be made of any appropriate material, such as silicon oxide, or silicon oxynitride, etc. Various processes may be used to form the dielectric material layer, such as a chemical vapor deposition (CVD) process, or a physical vapor deposition (PVD) process, etc.

The process for planarizing the dielectric material layer may be any appropriate process. In one embodiment, a chemical mechanical polishing (CMP) process is used to planarize the dielectric material layer to form the dielectric layer 203.

The opening 200 may be for subsequently accommodating a gate dielectric layer, a work function layer, a barrier structure, a first gate layer, and a second gate layer. In particular, a gate dielectric layer, a work function layer, a barrier structure, a first gate layer, and a second gate layer may be subsequently formed in the opening 200.

The aspect ratio (e.g., depth-to-width ratio) of the opening 200 may determine the thickness of the subsequently formed first gate layer. In particular, the ratio between a product of the thickness of the first gate layer and the aspect ratio of the opening 200 and the depth of the opening 200 may be in a range of approximately 15% to 40%.

In one embodiment, the aspect ratio of the opening 200 may be in a range of approximately 3:1 to 1:1.

Before forming the work function layer 201, a gate dielectric layer (not shown) may be formed at the bottom of the opening 200.

The gate dielectric layer may be made of a high dielectric constant (high-K) dielectric material, and K may be greater than 3.9. In one embodiment, the gate dielectric layer is made of $HfO_2$. In some embodiments, the gate dielectric layer may be made of other appropriate material, such as $La_2O_3$, HfSiON, $HfAlO_2$, $ZrO_2$, $Al_2O_3$, or $HfSiO_4$, etc.

The thickness of the gate dielectric layer may be in a range of approximately 16 Å-22 Å.

The material of the work function layer 201 may be related to the type of the to-be-formed transistor. When the to-be-formed transistor is a PMOS transistor, the material of the work function layer 201 may include titanium nitride, etc. When the to-be-formed transistor is an NMOS transistor, the material of the function layer 201 may include titanium aluminum, etc. The work function layer 201 may be used to adjust the threshold voltage of the semiconductor device.

The thickness of the work function layer 201 may be in a range of approximately 16 Å-22 Å.

After forming the work function layer 201, a first gate layer may be formed on the work function layer 201. Before forming the first gate layer, a barrier structure may be formed on top of the work function layer 201. The detailed structure may be referred to FIG. 3.

Figure 3:
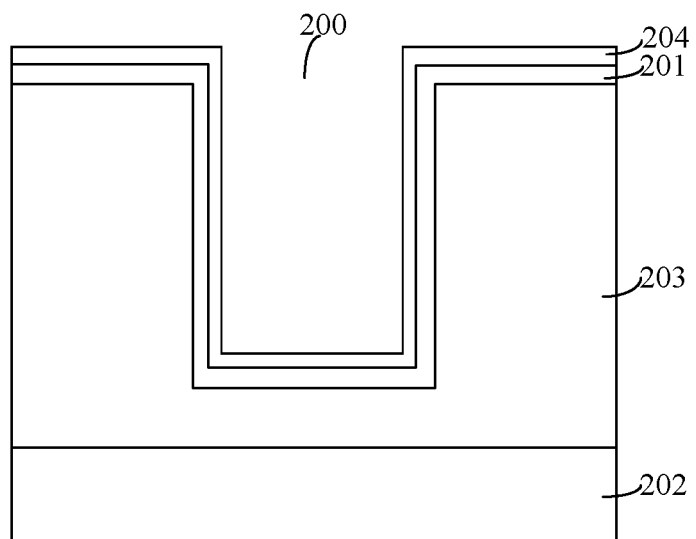

Returning to FIG. 8, after forming the working function layer, a barrier structure may be formed (S103). FIG. 3 illustrates a corresponding semiconductor structure.

As shown in FIG. 3, a barrier structure 204 may be formed on the top surface of the work function layer 201. The barrier structure 204 may be used for blocking the diffusion of atoms in the subsequently formed second gate layer into the work function layer 201.

The barrier structure 204 may include a first barrier layer (not labeled) on the top surface of the work function layer 201 and a second barrier layer (not labeled) on the top surface of the first barrier layer.

The material of the first barrier layer may include tantalum nitride, etc. The interface state between the first barrier layer and the work function layer 201 may be improved. Accordingly, the performance of the semiconductor device may be improved.

The material of the second barrier layer may include titanium nitride, etc. The interface state between the second barrier layer and the subsequently formed first gate layer may be improved. Accordingly, the performance of the semiconductor device may be improved.

The thickness of the barrier structure 204 may be in a range of approximately 60 Å-100 Å. The thickness of the barrier structure 204 may be substantially small. When the aspect ratio of the opening 200 is constant, it may facilitate to subsequently form the first gate layer and the second gate layer.

Figure 4:
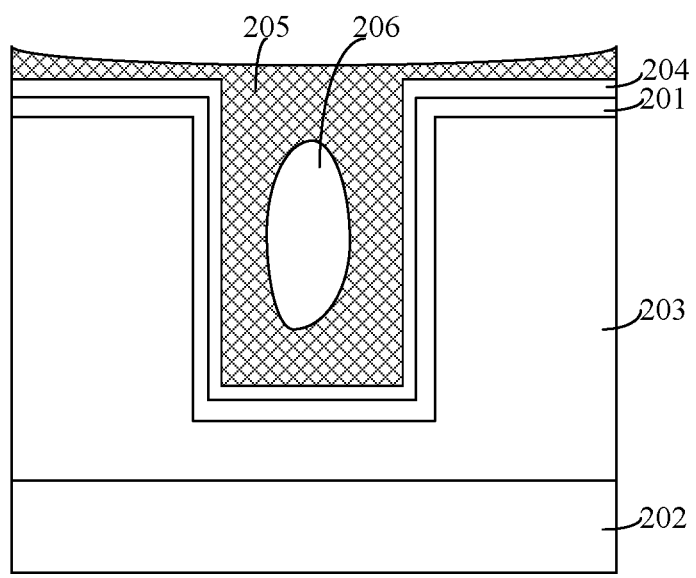

Returning to FIG. 8, after forming the barrier structure, a first gate structure may be formed (S103). FIG. 4 illustrates a corresponding structure.

As shown in FIG. 4, after forming the barrier structure 204, a first gate layer 205 is formed in the opening 200 (referring to FIG. 3). The first gate layer 205 may close the top of the opening 200; and the first gate layer 205 may include at least one void 206.

Because the aspect (depth-to-width) ratio of the opening 200 may be substantially large, during forming the first gate layer 205, the first gate layer 205 located on the top of the opening 200 may not only have a growth rate along a direction parallel to the top surface of the substrate 202, but also have a growth rate along a direction parallel to the sidewall surface of the opening 200. Thus, the first gate layer 205 may grow faster at the top of the opening 200. The first gate layer 205 on the sidewall surfaces of the opening 200 may only have a growth rate along the direction parallel to the surface of the semiconductor substrate 202. Thus, when the first gate layer 205 closes the top of the opening 200, the middle portion of the opening 200 may not be filled by the first gate layer 205. In particular, the void 206 may be formed.

The thickness of the first gate layer 205 may be in a range of approximately 60 Å-150 Å. When the thickness of the first gate layer 205 is less than 60 Å, it may be difficult for the first gate layer 205 to close the top of the opening 200. Accordingly, the subsequently formed second gate layer may be still located in the opening 200, and the atoms in the second gate layer may still easily pass through the first gate layer 205 and the barrier structure 204, and reach the work function layer 201 during a subsequent annealing process. Thus, the performance of the work function layer 201 may be adversely affected; and it may not facilitate to improve the performance of the semiconductor device. When the thickness of the first gate layer 205 is greater than 150 Å, it may be difficult for the atoms in the second gate layer subsequently formed on the first gate layer to pass through first gate layer 205 into the void 206. Thus, it may be difficult to fill the void 206. Accordingly, the resistance of the device may be substantially large, and the performance of the semiconductor device may be adversely affected.

The material of the first gate layer 205 may include titanium, and the interface states between the first gate layer 205 and the second barrier layer and the first gate layer 205 and the subsequent second gate layer may be improved. Accordingly, the performance of semiconductor device may be enhanced.

Various processes may be used to form the first gate layer 205. In one embodiment, a physical vapor deposition (PVD) process is used to form the first gate layer 205.

In one embodiment, the parameters of the PVD process may have a following combination. The bias power of the PVD process may be in a range of approximate 750 watts to 1500 watts. The bias power may be substantially large. Thus, the formed first gate layer 205 may be substantially dense, and the ability of the first gate layer 205 for blocking ions in the second gate layer may be enhanced. Accordingly, the effect of the ions in the second gate layer to the work function layer 201 may be reduced; and the performance of the semiconductor device may be improved. In some embodiments, the bias power may be less than 750 watts.

The void 206 may be used to subsequently accommodate the atoms of a portion of the second gate layer.

Figure 5:
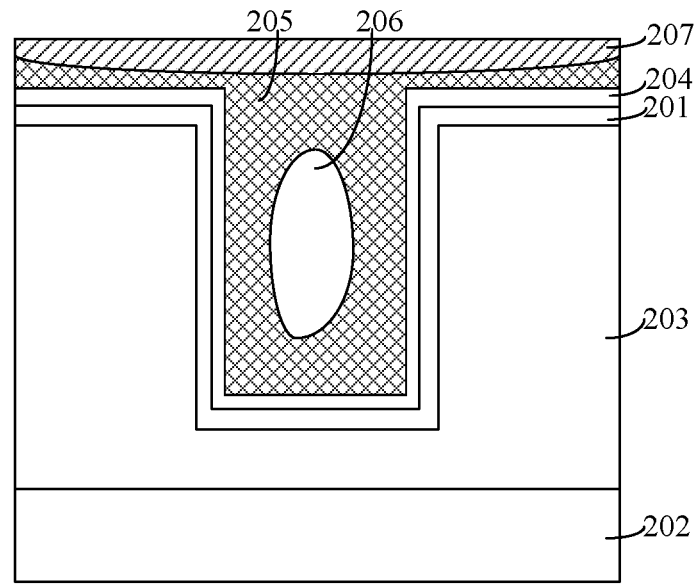

Returning to FIG. 8, after forming the first gate layer, a second gate layer may be formed (S104). FIG. 5 illustrates a corresponding structure.

As shown in FIG. 5, a second gate layer 207 is formed on the top surface of the first gate layer 205. The atomic radius of the material of the second gate layer 207 may be smaller than the gaps among the atoms of the material of the first gate layer 205.

The second gate layer 207 may be made of any appropriate material. In one embodiment, the second gate layer 207 is made of aluminum.

Various processes may be used to form the second gate layer 207, such as a chemical vapor deposition (CVD) process, or a physical vapor deposition (PVD) process, etc.

Because the first gate layer 205 may close the top of the opening 200, the second gate layer 207 may be located on the top surface of the first gate layer 205.

Returning to FIG. 8, after forming the second gate layer, an annealing process may be performed (S105). FIG. 6 illustrates a corresponding structure.

As shown in FIG. 6, an annealing process is performed, and the atoms of the material of the second gate layer 207 may pass through the first gate layer 205 to fill the void 206. In some embodiments, the atoms of the materials of the first gate layer may fill the void. In other embodiments, the void may be filled by the atoms of the material of the first gate layer and the atoms of the material of the second gate layer.

During the annealing process, the atoms in the material of the first gate layer 205 may react with the atoms in the material of 74 the second gate layer to form a gate structure (not labeled) in the opening 200 (referring to FIG. 3). The first gate layer may be made of titanium; and the second gate layer may be made of aluminum. Thus, the gate structure may be made of titanium aluminum.

The annealing temperature may be in a range of approximately 350° C.-450° C. The annealing time may be in range of approximately 120 seconds to 240 seconds. When the annealing temperature is less than 350° C., the atoms in the material of the second gate layer 207 may be difficult to pass through the first gate layer 205. After the annealing process, the first gate layer 205 may still have the void 206; and the resistance of the semiconductor device may be still substantially large. Accordingly, it may not facilitate to improve the performance of the semiconductor device. When the annealing temperature is greater than 450° C., the atoms in the material of the second gate layer 207 may pass through the first gate layer 205. The atoms of the second gate layer 207 arriving at the void 206 may still have a substantially high energy; and the atoms in the material of the second gate layer 207 in the void 206 may continue to pass through the barrier structure 204 to reach the work function layer 201. Thus, the performance of the work function layer 201 may be adversely affected; and it may not facilitate to improve the performance of the semiconductor device.

Because the second gate layer 207 may be formed on the top surface of the first gate layer 205, during the annealing process, the atoms in the material of the second gate layer 207 may first need to pass through the first gate layer 205 at the top of the opening 200. The thickness of the first gate layer 205 at the top of the opening 200 may be substantially thick. Thus, the second gate layer 207 may consume a large amount of energy in the process of passing through the first gate layer 205 at the top of the opening 200 to reach the void 206; and the energy of the atoms in the material of the second gate layer 207 may be substantially low. Accordingly, it may be difficult for the atoms in the material of the second gate layer 207 in the void 206 to pass through the first gate layer 205 and the barrier structure 204 to reach the work function layer 201. Thus, the performance of the work function layer 201 may be less affected; and the performance of the semiconductor device may be improved.

Moreover, the atoms in the material of the second gate layer 207 passing through of the first gate layer 205 may fill the gap 206. Thus, there may be no void in the first gate layer 205; and the resistance of the first gate layer 205 may be reduced. Accordingly, the electrical properties of the semiconductor device may be improved.

Returning to FIG. 8, after performing the annealing process, a planarization process is performed (S106). FIG. 7 illustrates a corresponding structure.

As shown in FIG. 7, the second gate layer 207, the first gate layer 205, the barrier structure 204, and the work function layer 201 may be planarized until the top surface of the dielectric layer 203 is exposed by a planarization process.

In one embodiment, the structure filled in the void 206 (referring to FIG. 6) may be the atoms from the second gate layer 207. Thus, as shown in FIG. 7, the structure may be still referred to as the second gate layer 207 after the planarization process. In some embodiments, the structure in the void may be the atoms from the first gate layer. In other embodiments, the structure in the void may be the atoms from both the first gate layer and the second gate layer The planarization process may be any appropriate process. In one embodiment, a chemical mechanical polishing (CMP) process is used to planarize the second gate layer 207, the first gate layer 205, the barrier structure 204, and the work function layer 201.

The present invention also provides a semiconductor structure. FIG. 6 illustrates a corresponding semiconductor structure.

As shown in FIG. 6, the semiconductor structure includes a base substrate. The base substrate may have an opening 200 (referring to FIG. 3). Further, the semiconductor structure may include a first gate layer 205 formed in the opening 200. The first gate layer 205 may close the top of the opening 206; and a void 206 may be formed in the first gate layer 205 (referring to FIG. 5).

Further, the semiconductor structure may include a second gate layer 207 formed on the top surface of the first gate layer 205. The atomic radius of the material of the second gate layer 207 may be smaller than gaps among atoms in the material of the first gate layer 205, and the void 206 may be filled by the atoms of the material of the first gate layer 205 and/or the atoms of the material of the second gate layer 207. The first gate layer 205 and the second gate layer 206 may together be referred to as a gate structure of the semiconductor structure.

The ratio between the product of the thickness of the first gate layer 205 and the aspect ratio of the opening 200 and the depth of the opening 200 may be in a range of approximately 15% to 40%.

The first gate layer 205 may be made of titanium. The second gate layer 207 may be made of aluminum.

Further, the semiconductor structure may include a gate dielectric layer (not shown) located at the bottom of the first gate layer 205 in the opening 200 and a work function layer 201 formed on the top surface of the gate dielectric layer; and a barrier structure 204 formed on the top surface of the work function layer 201.

The gate dielectric layer may be made of a high-K dielectric material. K may be greater than 3.9. When the transistor is a PMOS transistor, the material of the work function layer 201 may include titanium nitride. When the transistor is an NMOS transistor, the material of the work function layer 201 may include titanium. The thickness of the gate dielectric layer may be in a range of 16 Å-22 Å. The thickness of the work function layer 201 may be in a range of approximately 30 Å-50 Å.

The thickness of the barrier structure 204 may be in a range of approximately 60 Å-100 Å. The barrier structure 204 may include a first barrier layer on the top of surface of the work function layer 201 and a second barrier layer on the top surface of the first barrier layer. The first barrier layer may be made of tantalum nitride, etc.; and the second barrier layer may be made of titanium nitride, etc.

In particular, referring to FIG. 7, the semiconductor structure may include a semiconductor substrate 202 and a dielectric layer 203 on the semiconductor substrate 202. The semiconductor structure may also include a work function layer 201 formed in the dielectric layer 203 and a barrier structure 204 formed on the work function layer 201. Further, the semiconductor structure may include a first gate layer 205 formed on the barrier structure 204 and a second gate layer 207 formed in the first gate layer 205. The detailed structures and intermediate structures are described above with respect to the fabrication processes.

In the disclosed method for fabricating a semiconductor structure, the first gate layer may close the top of the opening, the second layer gate layer may be formed on the top surface of the first gate layer. The first gate layer may have at least one void. To fill the void, an annealing process may be subsequently performed to transfer the atoms in the material of the second gate layer or the atoms in the material of the first gate layer to void. During the annealing process, the atoms in the material of the second gate layer may consume a large amount of energy during passing the first gate layer. Thus, the energy of the atoms in the material of the second gate layer reaching the void may be substantially low. Accordingly, the atoms in the material of the second gate layer may be unable to move to other positions of the device. Thus, the effect of the atoms in the second gate layer to the devices at other positions may be reduced; and the performance of the semiconductor device may be improved.

Further, the first gate layer may be made of titanium; and the first gate layer may be formed by a physical vapor deposition process. The bias of the physical vapor deposition process may be substantially large. Thus, the density of the first gate layer may be substantially large; and the barrier ability of the first gate layer to the atoms in the second gate layer may be substantially large. Accordingly, it may further prevent the atoms in the second gate layer from moving the other position of the device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
a base substrate having an opening;
a first gate layer formed in the opening, wherein in the first gate layer closes a top of the opening and the first gate layer includes at least one void;
a second gate layer formed on the first gate layer, wherein an atomic radius of the material of the second gate layer is smaller than gaps among atoms of the material of the first gate layer and the void is filled by atoms of one of the material of the first gate layer and the material of the second gate layer;
a gate dielectric layer formed at a bottom of the opening;
a work function layer formed on the gate dielectric layer; and
a barrier structure formed on the work function layer, including:
a first barrier layer formed on a top surface of the work function layer, the first barrier layer being made of tantalum nitride; and
a second barrier layer formed on the first barrier layer, the second barrier layer being made of titanium nitride.

2. The semiconductor structure according to claim 1, wherein:
a ratio between a product of a thickness of the first gate layer and an aspect ratio of the opening and a depth of the opening is in a range of approximately 15%-40%.

3. The semiconductor structure according to claim 2, wherein:
the aspect ratio of the opening is in a range of approximately 3:1 to 1:1.

4. The semiconductor structure according to claim 2, wherein:
the thickness of the first gate layer is in a range of approximately 60 Å-150 Å.

5. The semiconductor structure according to claim 1, wherein:
the first gate layer is made of titanium; and
the second gate layer is made of aluminum.

6. The semiconductor structure according to claim 1, wherein:
the gate dielectric layer is made of a high-K dielectric material;
when the semiconductor structure is a PMOS transistor, the work function layer is made of titanium nitride;
when the semiconductor structure is an NMOS transistor, the work function layer is made of aluminum titanium;
a thickness of the gate dielectric layer is in a range of approximately 16 Å-22 Å; and
a thickness of the work function layer is in a range of approximately 30 Å-50 Å.

7. The semiconductor structure according to claim 1, wherein:
a thickness of the barrier structure is in a range of approximately 60 Å-100 Å.

* * * * *